(12) United States Patent
Shimizu et al.

(10) Patent No.: US 12,119,510 B2
(45) Date of Patent: Oct. 15, 2024

(54) BATTERY CONNECTION MODULE

(71) Applicant: Yazaki Corporation, Tokyo (JP)

(72) Inventors: Hidehiko Shimizu, Makinohara (JP); Keitaroh Nozawa, Makinohara (JP); Shuhei Urakami, Makinohara (JP); Shinji Kawai, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 155 days.

(21) Appl. No.: 17/387,304

(22) Filed: Jul. 28, 2021

(65) Prior Publication Data

US 2022/0037735 A1 Feb. 3, 2022

(30) Foreign Application Priority Data

Jul. 29, 2020 (JP) ................................. 2020-128036

(51) Int. Cl.
| | |
|---|---|
| *H01M 50/284* | (2021.01) |
| *H01M 10/0525* | (2010.01) |
| *H01M 50/209* | (2021.01) |
| *H01M 50/507* | (2021.01) |
| *H05K 1/02* | (2006.01) |

(52) U.S. Cl.
CPC ..... *H01M 50/284* (2021.01); *H01M 10/0525* (2013.01); *H01M 50/209* (2021.01); *H01M 50/507* (2021.01); *H05K 1/0277* (2013.01); *H05K 2201/10037* (2013.01)

(58) Field of Classification Search
None
See application file for complete search history.

(56) References Cited

U.S. PATENT DOCUMENTS

| | | | |
|---|---|---|---|
| 2011/0089900 A1* | 4/2011 | Hogari | H02J 7/00 320/118 |
| 2013/0202985 A1* | 8/2013 | Hirata | H01M 8/0206 |
| 2014/0287286 A1 | 9/2014 | Miyawaki et al. | |
| 2019/0027731 A1* | 1/2019 | Zeng | H01M 50/51 |
| 2020/0014005 A1 | 1/2020 | Lee et al. | |

FOREIGN PATENT DOCUMENTS

| | | |
|---|---|---|
| JP | 2014-182945 A | 9/2014 |
| JP | 2019-23996 A | 2/2019 |

\* cited by examiner

*Primary Examiner* — Matthew T Martin
*Assistant Examiner* — Krishna R Hammond
(74) *Attorney, Agent, or Firm* — Sughrue Mion, PLLC

(57) ABSTRACT

A battery connection module includes a plurality of bus bars provided on a battery stack in which a plurality of battery packs are assembled, and attached to electrodes of the battery packs, a flexible printed wiring board provided on the battery stack, and a first electronic component electrically connected to the flexible printed wiring board. The flexible printed wiring board includes a side surface portion which extends outward from above the battery stack and is bent so as to be fixed to a side surface of the battery stack, and the first electronic component is provided on the side surface portion.

8 Claims, 7 Drawing Sheets

ARRANGEMENT DIRECTION

ARRANGEMENT DIRECTION

BATTERY CONNECTION MODULE

CROSS-REFERENCE TO RELATED APPLICATIONS

This application is based on and claims priority under 35 USC 119 from Japanese Patent Application No. 2020-128036 filed on Jul. 29, 2020, the contents of which are incorporated herein by reference.

TECHNICAL FIELD

The present disclosure relates to a battery connection module.

BACKGROUND ART

A battery module that includes a plurality of cells is known, which includes a frame for holding and packaging a plurality of cells, and a cell monitoring circuit module installed on the frame (see, for example, JP-A-2014-182945). In the battery module described in JP-A-2014-182945, electronic components such as connectors and the like are mounted on a substrate of the cell monitoring circuit module installed on the frame.

SUMMARY OF INVENTION

In the battery module described in JP-A-2014-182945, since the electronic components such as connectors and the like with large heights from the substrate are mounted on the substrate on the frame, the reduction of the height of the battery module is hindered.

The present disclosure has been made in view of the circumstances described above, and an object of the present disclosure is to provide a battery connection module capable of reducing the height of the battery module.

A battery connection module of the present invention includes a plurality of bus bars provided on a battery stack in which a plurality of battery packs are assembled, and attached to electrodes of the battery packs, a flexible printed wiring board provided on the battery stack, and a first electronic component electrically connected to the flexible printed wiring board. The flexible printed wiring board includes a side surface portion that extends outward from above the battery stack and is bent, and thereby is fixed to a side surface of the battery stack.

DESCRIPTION OF EMBODIMENTS

Hereinafter, the present disclosure will be described according to preferred embodiments. The present disclosure is not limited to the embodiments described below, and can be appropriately modified within a scope that does not depart from the spirit of the present disclosure. In the embodiments illustrated below, the illustrations and explanations of certain configurations may be omitted, but it is apparent that publicly known or well-known techniques are appropriately applied to the details of the omitted techniques as long as no contradiction occurs with the contents described below.

Figure 1:
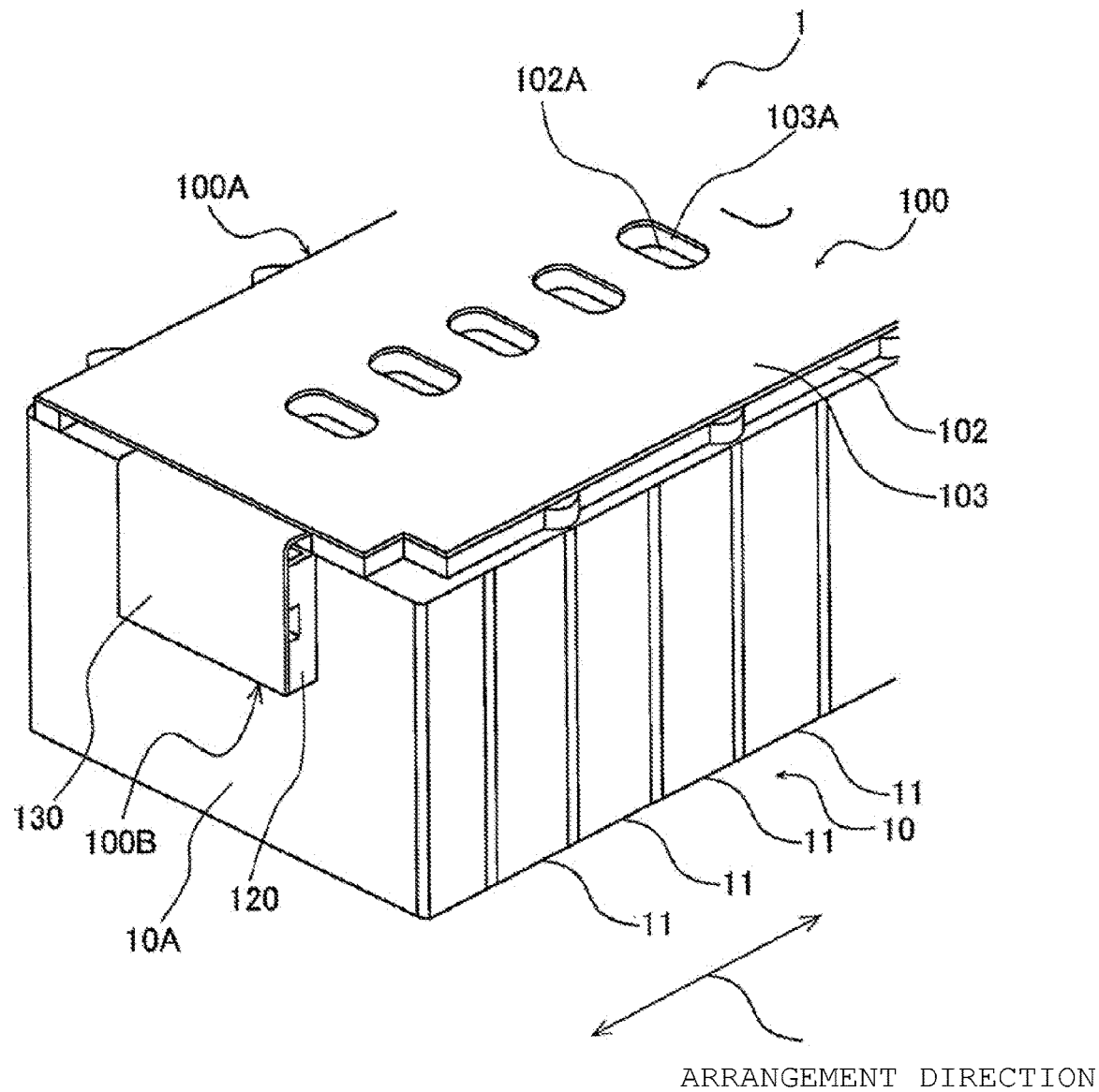
FIG. 1 is a perspective view illustrating a battery connection module, and a battery module that includes the battery connection module according to an embodiment of the present disclosure.

FIG. 1 is a perspective view illustrating a battery connection module 100 and a battery module 1 that includes the battery connection module 100 according to an embodiment of the present disclosure. As illustrated in FIG. 1, the battery module 1 includes a battery stack 10 and the battery connection module 100. The battery module 1 is mounted on, for example, an electric vehicle using a motor as a traveling drive source, a hybrid vehicle combining and using an internal combustion engine and a motor as a traveling drive source, and the like, and serves as a power source for the motor and the like.

The battery stack 10 is a battery pack that includes a plurality of plate-shaped battery packs 11. The plurality of battery packs 11 are arranged side by side in one direction and assembled and electrically connected in series. Hereinafter, the direction in which the battery packs 11 are arranged is referred to as an arrangement direction.

The battery pack 11 is a single battery such as a lithium ion secondary battery or the like, for example. A pair of electrodes 12 (see FIG. 2) are provided on an upper surface of the battery pack 11. The electrodes 12 are arranged closer to one end side or the other end side of the upper surface of the battery pack 11 in a longitudinal direction. One of the pair of electrodes 12 is a positive electrode, and the other of the pair of electrodes 12 is a negative electrode.

The battery connection module 100 includes an upper surface portion 100A and a side surface portion 100B. The upper surface portion 100A includes a plurality of bus bars 101 (see FIG. 2), a case 102, a cover 103, and an upper surface portion 110A (see FIG. 2) of a circuit substrate 110 for battery monitoring. The side surface portion 100B includes a side surface portion 110B (see FIG. 2) of the circuit substrate 110, a holder 120, and a cover 130.

The case 102 is formed of resin or the like, extended in the arrangement direction, and installed on the battery stack 10. The case 102 houses the bus bars 101 and the circuit substrate 110. A plurality of openings 102A are formed along the arrangement direction in a central portion of the case 102 in a width direction (direction orthogonal to the arrangement direction). Each opening 102A is arranged to face a valve (not illustrated) provided on an upper surface of the battery pack 11.

The case 102 is open upward, and the cover 103 is attached to the case 102 so as to close the opening of the case 102. The cover 103 is a plate formed of metal or the like and extended in the arrangement direction. A plurality of openings 103A are formed along the arrangement direction in the central portion of the cover 103 in the width direction (direction orthogonal to the arrangement direction). Each opening 103A is arranged to face the opening 102A.

The cover 130 is integrally formed at one end portion of the cover 103 in the longitudinal direction. The cover 130 is perpendicular to the cover 103. The cover 130 is attached to the holder 120. The holder 120 is attached to a side surface 10A of the battery stack 10.

Figure 2:
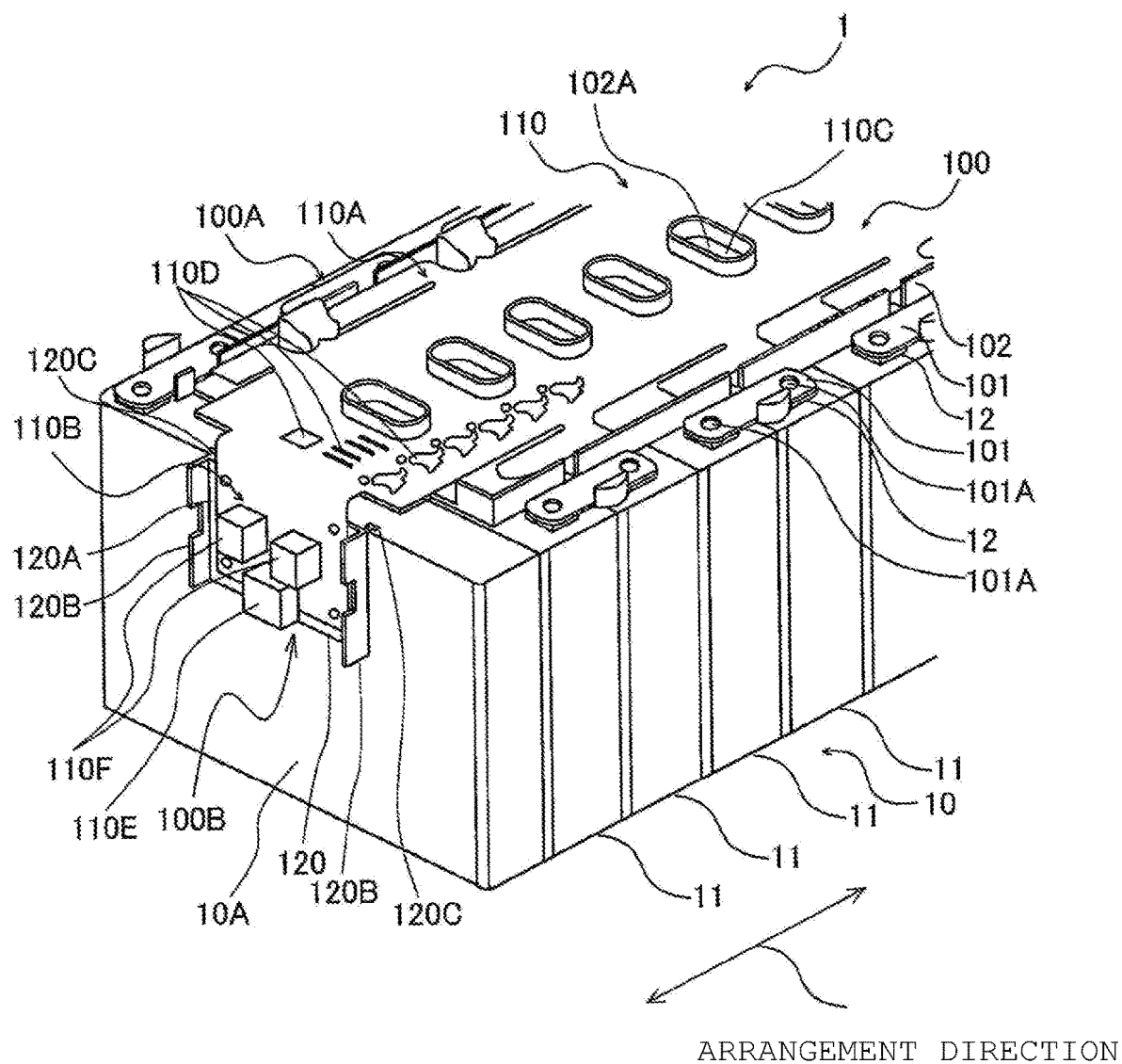
FIG. 2 is a perspective view illustrating a battery connection module before a cover is attached thereto, and the battery module including the battery connection module.

FIG. 2 is a perspective view illustrating the battery connection module 100 before the cover 103 is attached thereto, and the battery module 1 including the battery connection module 100. As illustrated in FIG. 2, the bus bar 101 is a conductive metal plate having an oval shape. A pair of fastening holes 101A are formed in the bus bar 101. The pitch of the pair of fastening holes 101A is the same as the pitch of the electrodes 12 in the arrangement direction. A fastening bolt (not illustrated) is inserted into the fastening hole 101A. This bolt is screwed into a screw hole formed in the electrode 12. As a result, the bus bar 101 and the electrodes 12 are fastened together, and the electrodes 12 of the adjacent battery packs 11 are electrically connected to each other.

The circuit substrate 110 is a flexible printed wiring board. The circuit substrate 110 includes the upper surface portion 110A extended in the case 102 in the arrangement direction, and the side surface portion 110B extended outward from one end portion of the upper surface portion 110A in the longitudinal direction and bent. A plurality of openings 110C are formed along the arrangement direction in the central portion of the upper surface portion 110A in the width direction (direction orthogonal to the arrangement direction). Each opening 110C is arranged to face each opening 102A.

Here, on the upper surface portion 110A, electronic components with a large height from the circuit substrate 110, such as connectors, coils, high-capacity chip capacitors, and the like are not mounted, and only electronic components 110D such as battery monitoring ICs, chip resistors, fuses, and chip-type NTC thermistors, that is, only the electronic component 110D that have a smaller height from the circuit substrate 110 than the connectors, coils, high-capacity chip capacitors, and the like, are mounted. Therefore, the height from the upper surface portion 110A to the cover 103 of the circuit substrate 110 is preferably equal to or larger than the height of the low-height electronic component 110D such as the battery monitoring IC and the like.

In contrast, a connector 110E and a coil 110F are mounted on the side surface portion 110B of the circuit substrate 110. A high-capacity chip capacitor may be mounted on the side surface portion 110B. A low-height electronic component may be mounted on the side surface portion 110B, if necessary.

Figure 3:
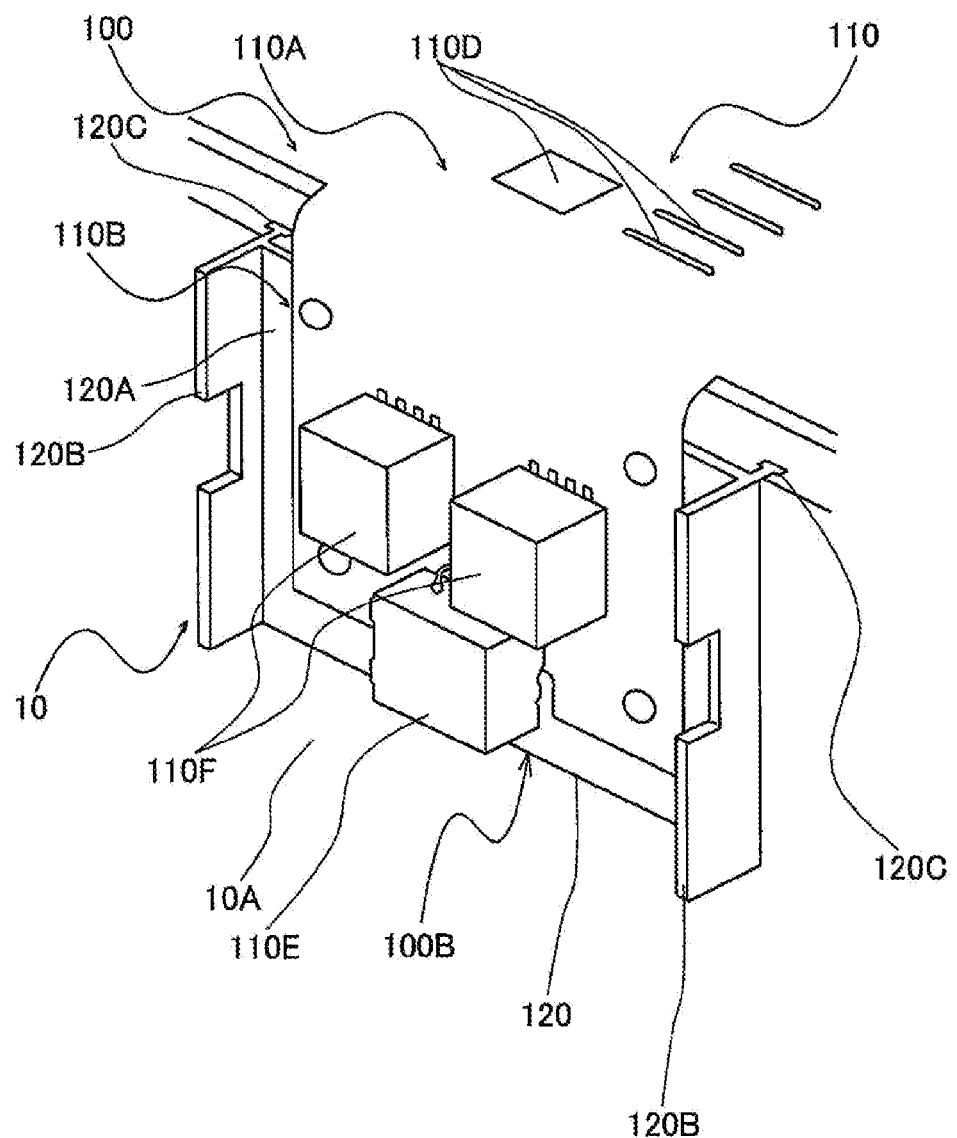
FIG. 3 is an enlarged perspective view illustrating a side surface portion of the battery connection module illustrated in FIG. 2.

FIG. 3 is an enlarged perspective view illustrating the side surface portion 100B of the battery connection module 100 illustrated in FIG. 2. As illustrated in FIG. 3, the side surface portion 110B is fixed to the side surface 10A on one end side in the arrangement direction of the battery stack 10 via the holder 120. The holder 120 is formed of resin or the like. The holder 120 includes a rectangular plate-shaped plate portion 120A to which the side surface portion 110B is attached, a pair of side wall portions 120B provided on both the left and right sides of the plate portion 120A, and an engaging portion 120C provided on each side wall portion 120B.

Figure 4:
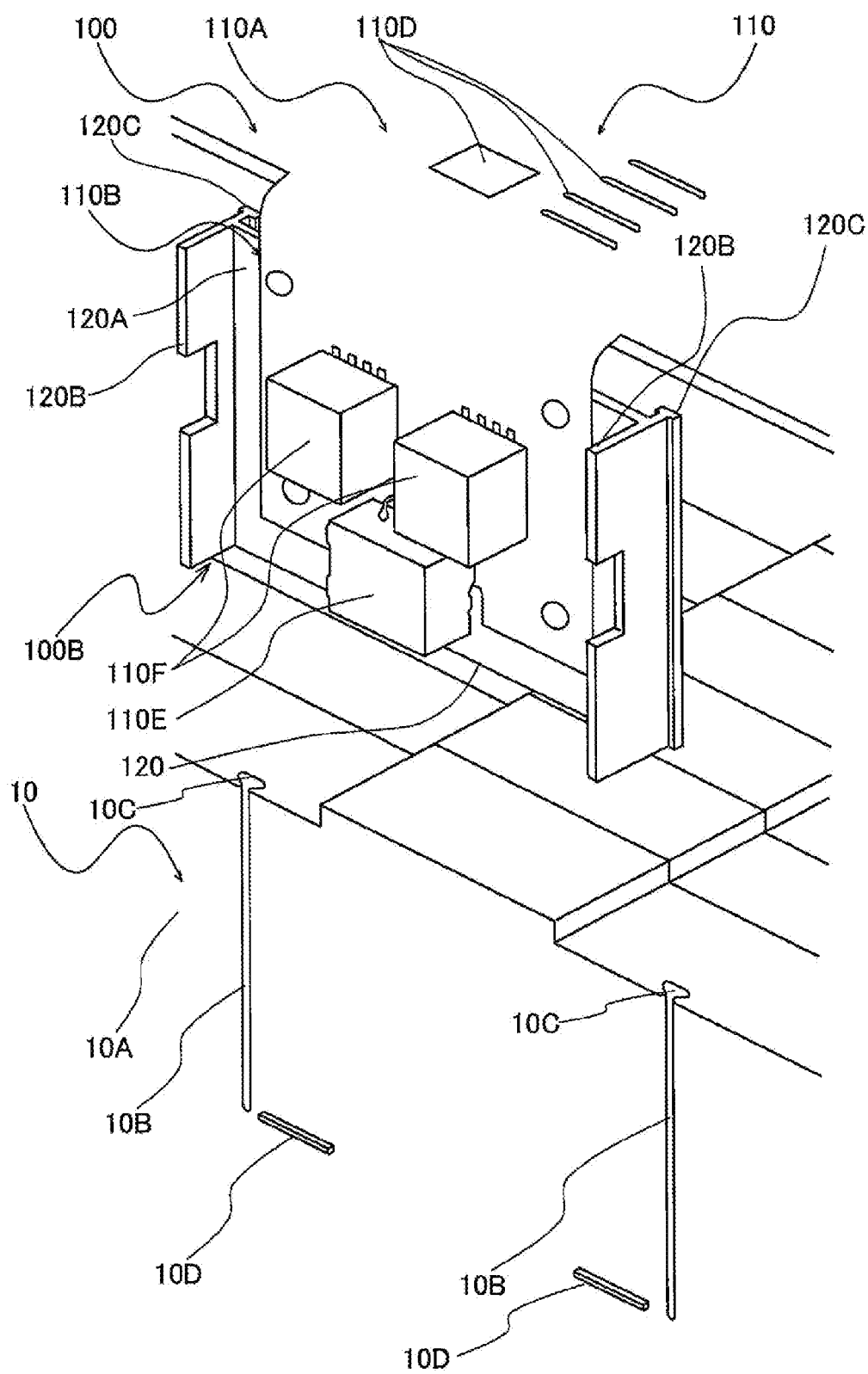
FIG. 4 is a perspective view illustrating a state when the side surface portion of the battery connection module illustrated in FIG. 3 is attached to a side surface of a battery stack.

FIG. 4 is a perspective view illustrating a state when the side surface portion 100B of the battery connection module 100 illustrated in FIG. 3 is attached to the side surface 10A of the battery stack 10. As illustrated in FIG. 4, the side wall portion 120B of the holder 120 is a rectangular plate-shaped portion extended along the left side or the right side of the plate portion 120A. The side wall portion 120B is extended from the left side or the right side of the plate portion 120A to both a front surface side (side surface portion 110A side) of the plate portion 120A and a back surface side (side surface 10A side of the battery stack 10) of the plate portion 120A.

In this case, a pair of slits 10B are formed parallel to each other in the side surface 10A of the battery stack 10. The pair of slits 10B are extended from an upper end of the side surface 10A along a height direction to an intermediate portion in the height direction. One end portion of the pair of side wall portions 120B in the width direction is inserted into the pair of slits 10B. Each slit 10B is extended in width from the front side to the back side, and an engaged portion 10C is formed in the back portion.

In contrast, the engaging portion 120C is formed at one end portion of the side wall portion 120B in the width direction. The engaging portion 120C is extended from one end portion of the side wall portion 120B in the width direction to both sides of the side wall portion 120B in the thickness direction, and engages with the engaged portion 10C of the slit 10B.

A pair of ribs 10D are formed between lower end portions of the pair of slits 10B on the side surface 10A. The pair of ribs 10D are horizontal and are horizontally spaced apart from each other. A lower end of the holder 120 comes into contact with the pair of ribs 10D.

As described above, in the battery connection module 100 according to the present embodiment, the circuit substrate 110 on the battery stack 10 is configured of a flexible printed wiring board, and the side surface portion 110B, which is a part of the circuit substrate 110, is extended outward from above the battery stack 10 and is bent and thereby is fixed to the side surface 10A of the battery stack 10. A connector 110E and a coil 110F, which are electronic components with a large height from the circuit substrate 110, are mounted on the side surface portion 110B. As a result, since only the electronic component 110D with a lower height than the connector 110E and the coil 110F is mounted on the upper surface portion 110A of the circuit substrate 110 on the battery stack 10, it is possible to prevent the reduction in height of the battery module 1 from being hindered due to the heights of the electronic components mounted on the circuit substrate 110, and, in combination with the fact that the circuit substrate 110 is formed of the flexible printed wiring board, the reduction in height of the battery module 1 can be realized.

The side wall portion 120B of the holder 120 is inserted into the slit 10B formed on the side surface 10A of the battery stack 10, and the engaging portion 120C of the side wall portion 120B is engaged with the engaged portion 10C of the slit 10B, so that the side surface portion 110B of the circuit substrate 110 can be attached to the side surface 10A of the battery stack 10. Therefore, the side surface portion 110B of the circuit substrate 110 can be easily attached to, and prevented from coming off from the side surface 10A of the battery stack 10. A separate component for fixing the holder 120 to the side surface 10A of the battery stack 10 can be eliminated.

Figure 5:
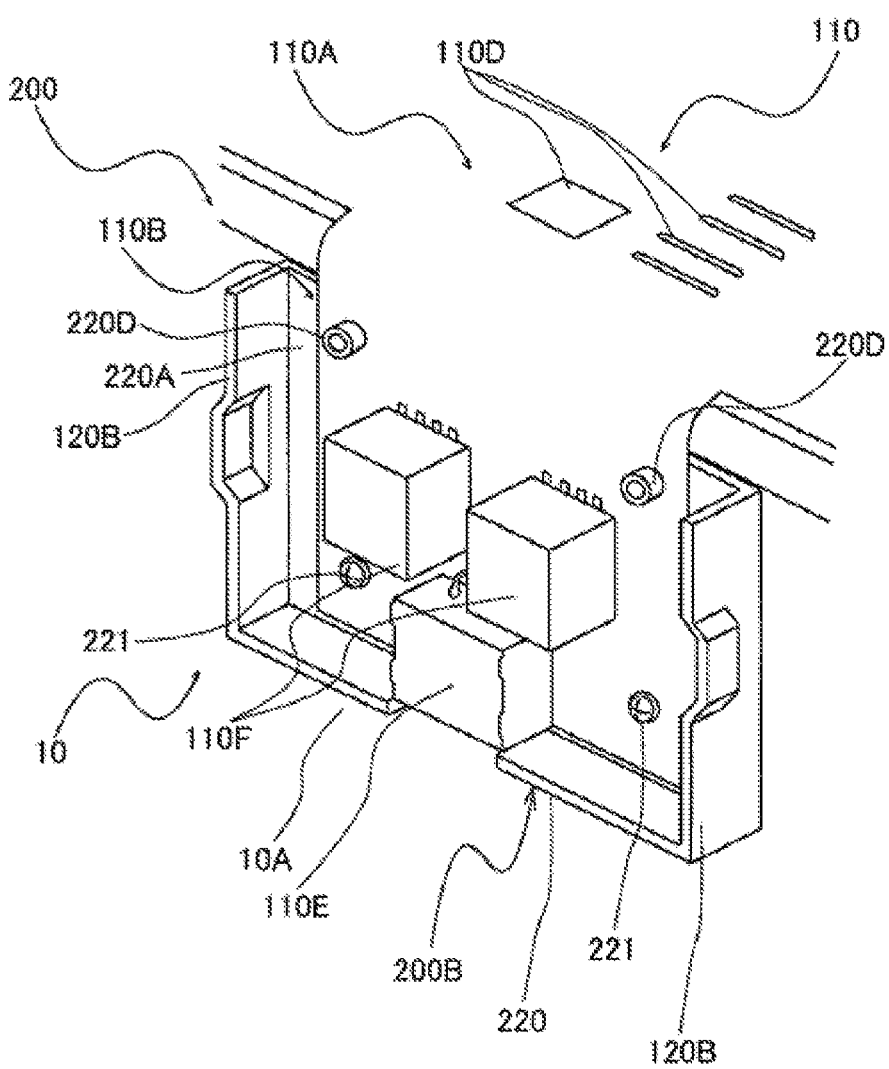
FIG. 5 is an enlarged perspective view illustrating a side surface portion of a battery connection module according to another embodiment of the present disclosure.

FIG. 5 is an enlarged perspective view illustrating a side surface portion 200B of a battery connection module 200 according to another embodiment of the present disclosure. In addition, the same configurations as those in the embodiment described above will be given the same reference numerals and refer to the description of the embodiment described above.

As illustrated in FIG. 5, the battery connection module 200 according to the present embodiment includes a holder 220 instead of the holder 120 according to the embodiment described above. The holder 220 is fastened and fixed to the side surface 10A of the battery stack 10 by a plurality of screws 221.

A pair of bosses 220D and a pair of screw insertion holes (not illustrated) are formed in the plate portion 220A of the holder 220. The pair of bosses 220D are arranged on upper-left and upper-right sides of the plate portion 220A, and a pair of holes are formed in the side surface portion 110B of the circuit substrate 110 to be fitted with the bosses 220D. A pair of screw insertion holes are arranged in lower-left and lower-right sides of the plate portion 220A, and holes are formed in the side surface portion 110B of the circuit substrate 110 to be inserted with the screws 221. A screw hole is formed in the side surface 10A of the battery stack 10 to be screwed with the screw 221.

That is, in the battery connection module 200 according to the present embodiment, the side surface portion 110B of the circuit substrate 110 and the holder 220 are fastened together with the side surface 10A of the battery stack 10 by a plurality of screws 221.

Therefore, the side surface portion 110B of the circuit substrate 110 can be easily attached to, and prevented from coming off from the side surface 10A of the battery stack 10.

Figure 6:
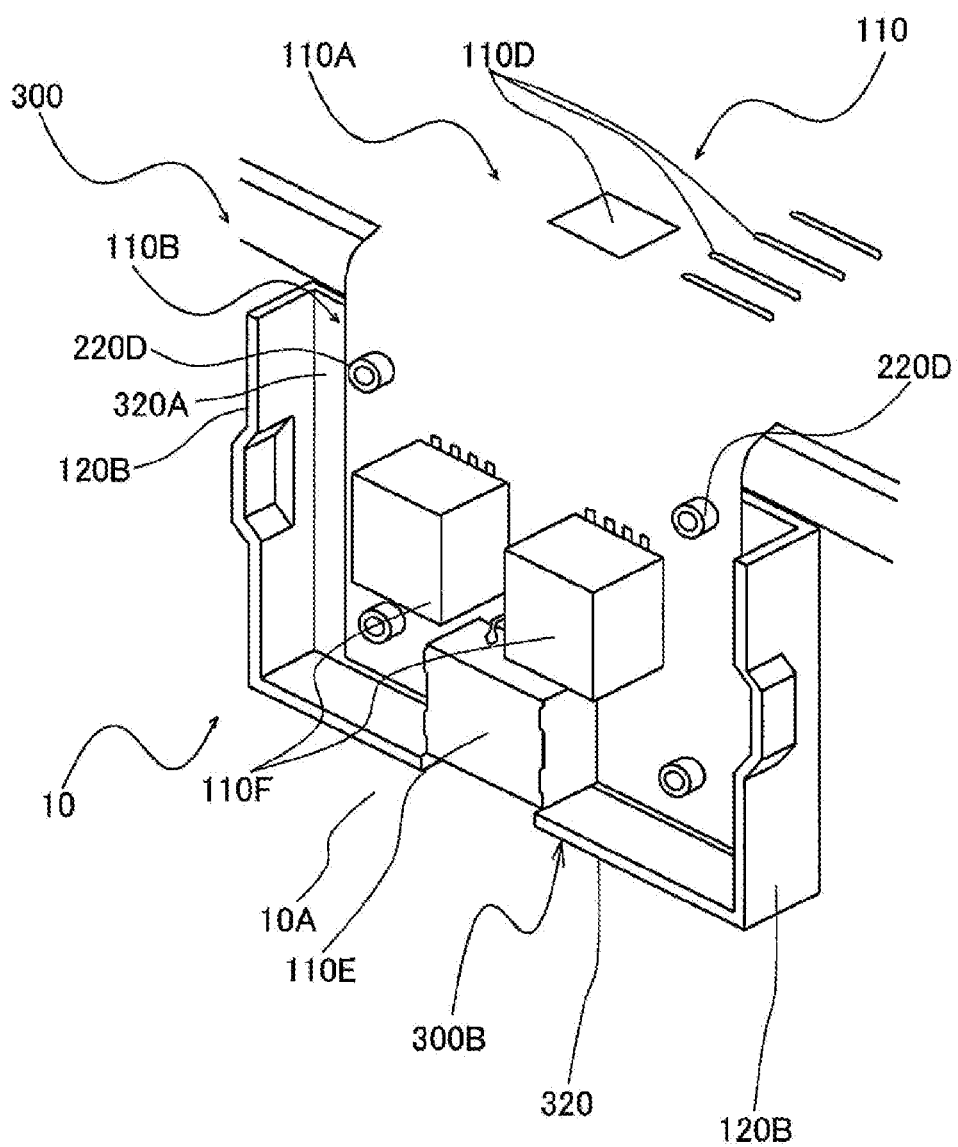
FIG. 6 is an enlarged perspective view illustrating a side surface portion of a battery connection module according to another embodiment of the present disclosure.
Figure 7:
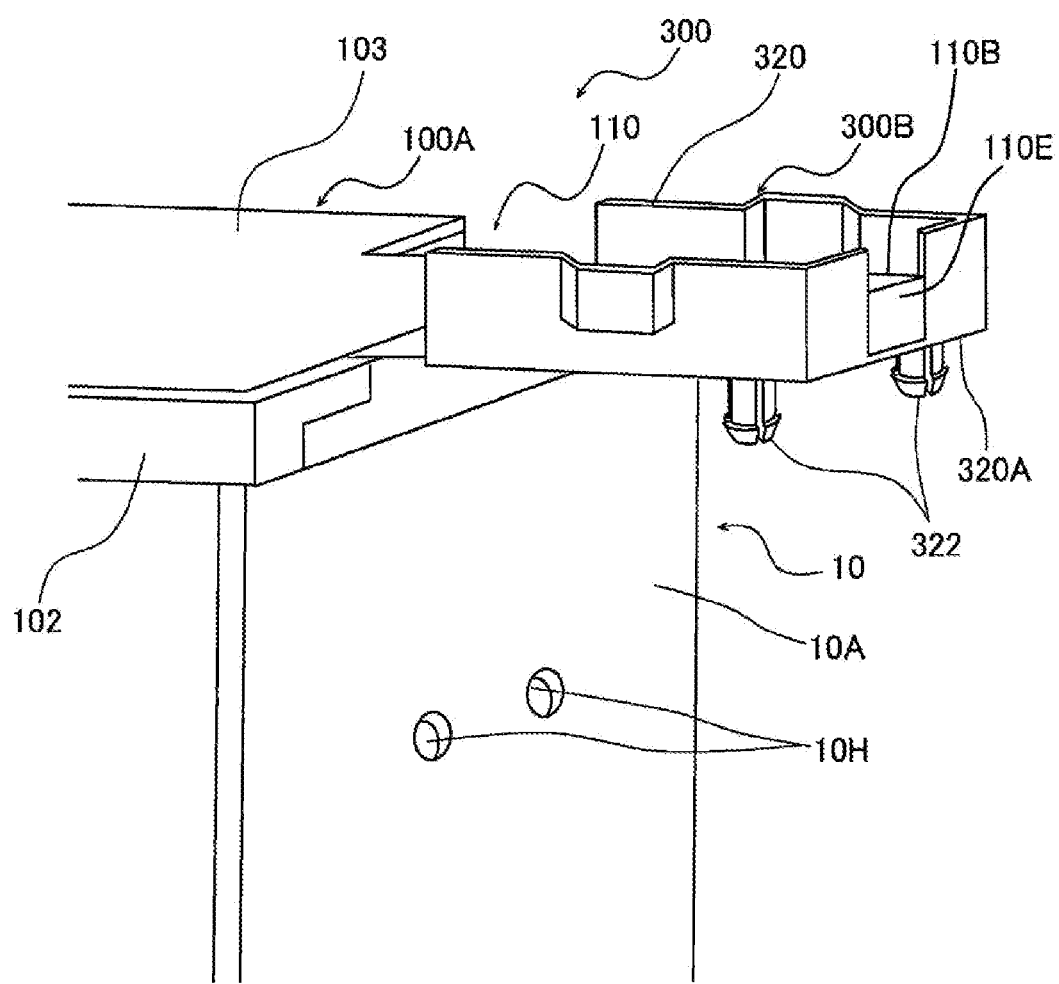
FIG. 7 is a perspective view illustrating a state when the side surface portion of the battery connection module illustrated in FIG. 6 is attached to a side surface of a battery stack.

FIG. 6 is an enlarged perspective view illustrating a side surface portion 300B of a battery connection module 300 according to another embodiment of the present disclosure. FIG. 7 is a perspective view illustrating a state when the side surface portion 300B of the battery connection module 300 illustrated in FIG. 6 is attached to the side surface 10A of the battery stack 10. In addition, the same configurations as those in the embodiment described above will be given the same reference numerals and refer to the description of the embodiment described above.

As illustrated in FIGS. 6 and 7, the battery connection module 300 according to the present embodiment includes a holder 320 instead of the holders 120, 220 according to the embodiments described above. The holder 320 is fixed to the side surface 10A of the battery stack 10 by bosses 322 (see FIG. 7).

As illustrated in FIG. 7, a pair of bosses 322 are formed on a back surface of the holder 320. The bosses 322 are engaging members that are engaged with holes by so-called snap-fits. The bosses 322 are divided into a plurality of parts in a circumferential direction by a plurality of slits, and are elastically deformed in a radial direction. A base end side of the boss 322 has a cylindrical shape, and a tip end side of the boss 322 is an engaging portion having a truncated cone shape.

The bosses 322 are arranged on lower-left and lower-right sides of the back surface of the holder 320, and a pair of holes 10H are formed in the side surface 10A of the battery stack 10, into which the bosses 322 are inserted and engaged. That is, in the battery connection module 300 according to the present embodiment, the holder 320 can be fixed to the side surface 10A of the battery stack 10 simply by pushing the bosses 322 into the holes 10H. Therefore, the side surface portion 110B of the circuit substrate 110 can be easily attached to, and prevented from coming off from the side surface 10A of the battery stack 10. A separate component for fixing the holder 320 to the side surface 10A of the battery stack 10 can be eliminated.

As described above, while the disclosure has been described based on certain embodiments, the present disclosure is not limited to the embodiments described above, and modifications may be performed without departing from the spirit of the present disclosure, and well-known and publicly known techniques may be combined as appropriate.

For example, while the connector 110E and the coil 110F as a first electronic component are mounted on the side surface portion 110B of the circuit substrate 110 in the embodiments described above, it is also possible that only the connector 110E, or only the coil 110, or only the high-capacity chip capacitor is mounted on the side surface portion 110B. Further, other electronic components having the same height dimensions as the related connector 110E and coil 110F may be mounted on the side surface portion 110B.

In the battery connection module, the flexible printed wiring board may include an upper surface portion fixed on the battery stack, and may include a second electronic component provided on the upper surface portion and having a lower height from the flexible printed wiring board than that of the first electronic component.

In the battery connection module, the first electronic component may include at least one of a connector, a coil, and a chip capacitor.

The battery connection module may include a holder to which the side surface portion of the flexible printed wiring board is attached, and the holder may include an insertion portion inserted into a slit provided on the side surface of the battery stack, and an engaging portion provided at the insertion portion and engaging with an engaged portion provided at a back side of the slit.

The battery connection module may include a holder to which the side surface portion of the flexible printed wiring board is attached, and the holder and the side surface portion may be fastened together with the side surface of the battery stack by a fastening member.

The battery connection module may include a holder to which the side surface portion of the flexible printed wiring board is attached, and the holder may include bosses that are inserted into and engaged with holes provided in the side surface of the battery stack.

According to the present disclosure, the substrate on the battery stack is configured of a flexible printed wiring board, and a side surface portion which is a portion of the flexible printed wiring board and on which the first electronic component is provided, is extended outward from above the battery stack and is bent and fixed to a side surface of the battery stack, thereby suppressing a height of the battery connection module from above the battery stack. Therefore, it is possible to reduce the height of the battery module including the battery connection module according to the present disclosure.

What is claimed is:

1. A battery connection module comprising:
a plurality of bus bars provided on a battery stack in which a plurality of battery packs are assembled, and attached to electrodes of the battery packs;
a flexible printed wiring board provided on the battery stack;
a first electronic component electrically connected to the flexible printed wiring board;
a case provided on the battery stack, housing the bus bars and the flexible printed wiring board, and opening upward; and
a cover attached to the case so as to close the opening of the case, wherein the flexible printed wiring board includes a side surface portion that extends outward from above the battery stack and is bent so as to be fixed to a side surface of the battery stack, the first electronic component is provided on the side surface portion, a plurality of first openings extending in an arrangement direction of the battery packs are formed in the case, and arranged to face a valve provided on an upper surface of the battery stack, respectively, a plurality of second openings extending in the arrangement direction are formed in the cover, and arranged to align with the plurality of first openings, respectively, and a plurality of third openings extending in the arrangement direction are formed in the flexible printed wiring board, and arranged to align with the plurality of first openings in a direction perpendicular to the arrangement direction, and to align with the plurality of second openings in the arrangement direction, respectively.

2. The battery connection module according to claim 1, wherein
the flexible printed wiring board includes:
an upper surface portion housed in the case provided on the battery stack; and
a second electronic component provided on the upper surface portion and having a lower height from the flexible printed wiring board than that of the first electronic component.

3. The battery connection module according to claim 1, wherein the first electronic component includes at least one of a connector, a coil, and a chip capacitor.

4. The battery connection module according to claim 1, further comprising:
a holder to which the side surface portion of the flexible printed wiring board is attached, wherein the holder includes:
an insertion portion inserted into a slit provided on the side surface of the battery stack; and
an engaging portion provided at the insertion portion and engaged with an engaged portion provided at a back side of the slit.

5. The battery connection module according to claim 1, further comprising:
a holder to which the side surface portion of the flexible printed wiring board is attached,
wherein the holder and the side surface portion are fastened together with the side surface of the battery stack by a fastening member.

6. The battery connection module according to claim 1, further comprising:
a holder to which the side surface portion of the flexible printed wiring board is attached,
wherein the holder includes bosses that are inserted and engaged with holes provided in the side surface of the battery stack.

7. The battery connection module according to claim 1, wherein the plurality of first openings, the plurality of second openings, and the plurality of third openings all have a same shape.

8. The battery connection module according to claim 7, wherein the same shape is circular.

* * * * *